United States Patent
Wang et al.

(10) Patent No.: US 8,586,290 B2
(45) Date of Patent: Nov. 19, 2013

(54) PATTERNING PROCESS AND CHEMICAL AMPLIFIED PHOTORESIST COMPOSITION

(75) Inventors: Chien-Wei Wang, Wufong Township, Taichung County (TW); Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 782 days.

(21) Appl. No.: 12/622,230

(22) Filed: Nov. 19, 2009

(65) Prior Publication Data
US 2011/0097670 A1    Apr. 28, 2011

Related U.S. Application Data

(60) Provisional application No. 61/254,305, filed on Oct. 23, 2009.

(51) Int. Cl.
| G03F 7/039 | (2006.01) |
| G03F 7/20 | (2006.01) |
| G03F 7/30 | (2006.01) |
| G03F 7/38 | (2006.01) |

(52) U.S. Cl.
USPC ......... 430/326; 430/311; 430/330; 430/270.1

(58) Field of Classification Search
None
See application file for complete search history.

(56) References Cited

U.S. PATENT DOCUMENTS

| 6,777,161 B2* | 8/2004 | Yasunami et al. ......... 430/270.1 |
| 2004/0053162 A1* | 3/2004 | Uenishi et al. ............ 430/270.1 |
| 2008/0187863 A1* | 8/2008 | Shibuya ..................... 430/281.1 |

* cited by examiner

Primary Examiner — Sin J. Lee
(74) Attorney, Agent, or Firm — Haynes and Boone, LLP

(57) ABSTRACT

A lithography method includes forming a photosensitive layer on a substrate, exposing the photosensitive layer, baking the photosensitive layer, and developing the exposed photosensitive layer. The photosensitive layer includes a polymer that turns soluble to a base solution in response to reaction with acid, a plurality of photo-acid generators (PAGs) that decompose to form acid in response to radiation energy, and a plurality of quenchers having boiling points distributed between about 200 C and about 350 C. The quenchers also have molecular weights distributed between 300 Dalton and about 20000 Dalton, and are vertically distributed in the photosensitive layer such that a first concentration C1 at a top portion of the photosensitive layer is greater than a second concentration C2 at a bottom portion of the photosensitive layer.

21 Claims, 7 Drawing Sheets

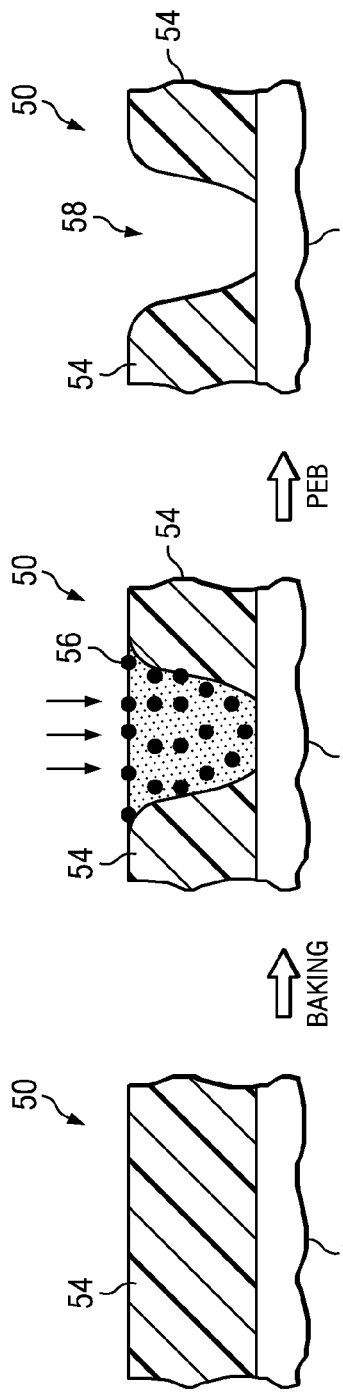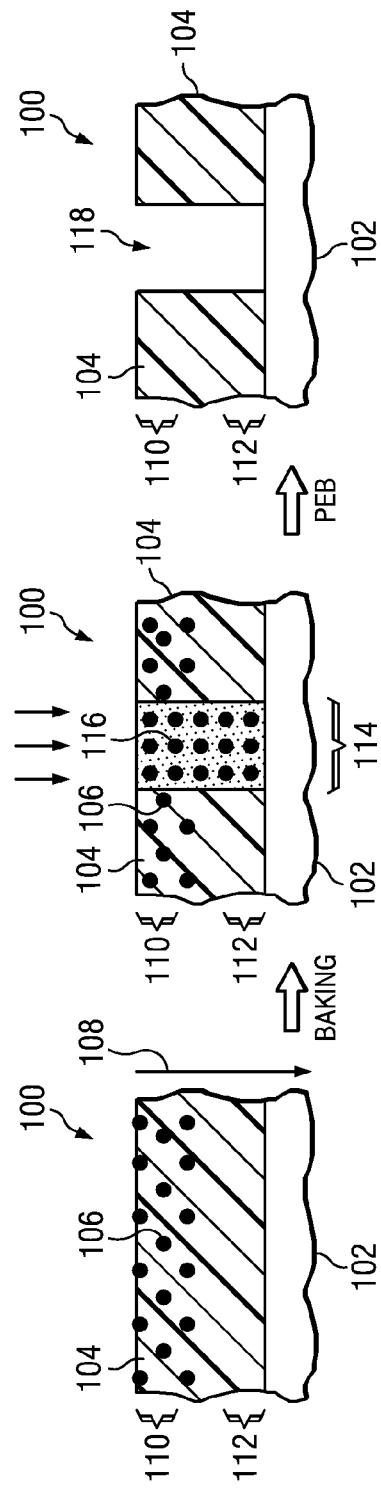

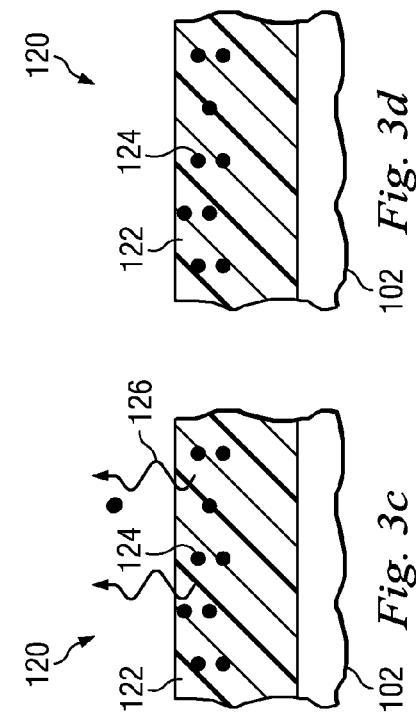
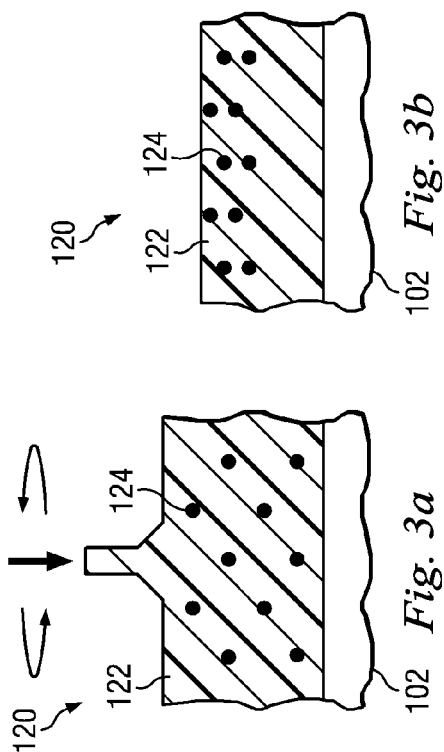
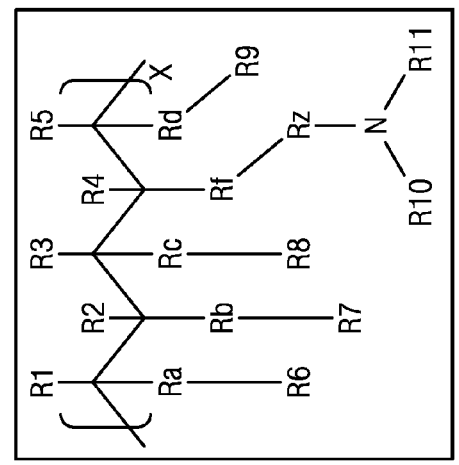
Fig. 4b
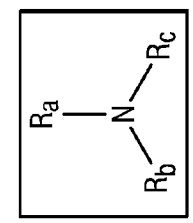
Fig. 4a

| TECHNOLOGY FEATURES | REGULAR PHOTORESIST | SURFACE SWITCHABLE PHOTORESIST | PHOTORESIST WITH HIGH BP QUENCHER |
|---|---|---|---|
| PHASE SEPARATION | YES | YES | YES |
| WATER RESISTANCE | POOR | GOOD | GOOD |
| OUT GASING | HIGH RISK | LOW RISK | LOW RISK |
| QUENCHING FUNCTION | YES | NO | YES |
| PROFILE TUNNING | MEDIUM | POOR | GOOD |
| CHEMICAL STRUCTURE | SMALL AMINE, M.W.<300 | SUBSTANTIALLY NEUTRAL OR ACIDIC POLYMER | SUBSTANTIALLY NEUTRAL OF BASIC POLYMER |
| SOLUBLE IN DEVELOPER | DEPENDS ON STRUCTURE | YES | DEPENDS ON STRUCTURE |

Fig. 8

| TECHNOLOGY FEATURES | REGULAR PHOTORESIST QUENCHER | THIS INNOVATION WITH HIGH BOILING AMINE QUENCHER | THIS INNOVATION WITH HIGH BOILING POLYMERIC QUENCHER |
|---|---|---|---|
| M.W. | 100 ~ 300 | 300 ~ 1000 | 1000 ~ 20000 |
| B.P. | 100 ~ 250 | 200 ~ 350 | >300 |
| WATER RESISTANCE | POOR | MID | GOOD |
| OUT GASING | HIGH RISK | LOW RISK | LOW RISK |
| PROFILE TUNNING | POOR | GOOD | GOOD |

Fig. 9

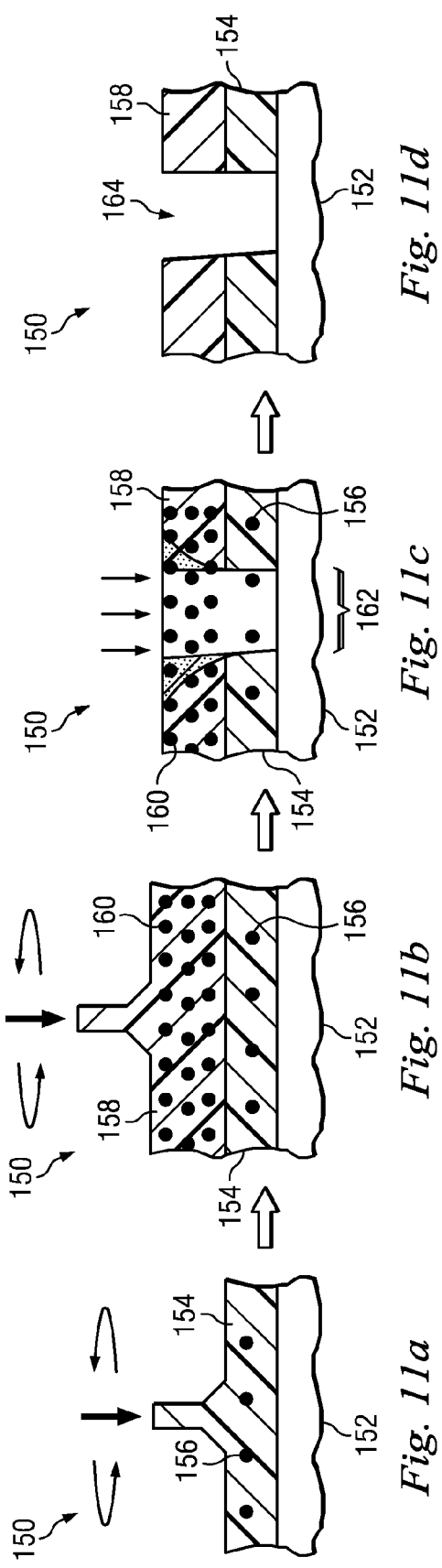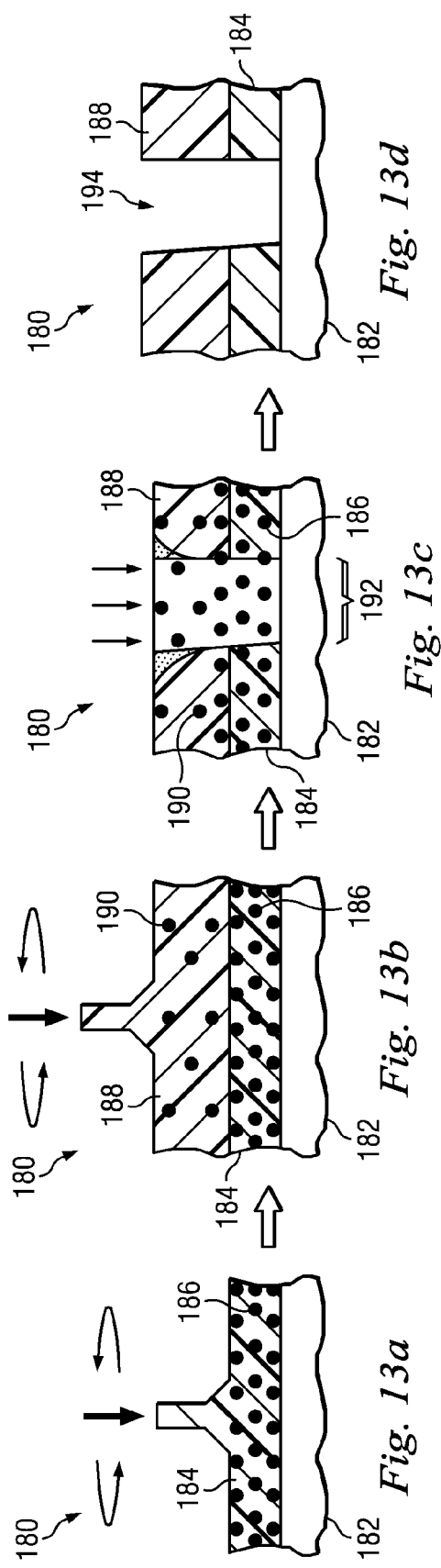

PATTERNING PROCESS AND CHEMICAL AMPLIFIED PHOTORESIST COMPOSITION

CROSS REFERENCE

This application claims the benefit of U.S. Provisional Application 61/254,305 entitled "Patterning Process and Chemical Amplified Photoresist Composition," filed Oct. 23, 2009, herein incorporated by reference in its entirety.

BACKGROUND

Semiconductor technologies are continually progressing to smaller feature sizes, down to 65 nanometers, 45 nanometers, and below. A patterned photoresist layer used to produce such small feature sizes typically has a high aspect ratio. Maintaining a desired critical dimension (CD) can be very difficult for various reasons. For example, when a chemical amplified photoresist layer is used, the patterned photoresist layer can have a top rounding profile.

SUMMARY

The present disclosure describes a lithography method, photolithography material, and a device produced by such method and products. In one embodiment, the method includes forming a photosensitive layer on a substrate, exposing the photosensitive layer, baking the photosensitive layer, and developing the exposed photosensitive layer. The photosensitive layer includes a polymer that turns soluble to a base solution in response to reaction with acid, a plurality of photo-acid generators (PAGs) that decompose to form acid in response to radiation energy, and a plurality of quenchers having boiling points distributed between about 20° C. and about 35° C. The quenchers also have molecular weights distributed between 300 Dalton and about 20000 Dalton, and are vertically distributed in the photosensitive layer such that a first concentration C1 at a top portion of the photosensitive layer is greater than a second concentration C2 at a bottom portion of the photosensitive layer.

In another embodiment, a method for a lithography process includes forming a first photosensitive layer on a substrate, forming a second photosensitive layer on the first photosensitive layer, and performing an exposing process to the first and second photosensitive layers. The first photosensitive layer includes a first photo-acid generator (PAG) distributed in the first photosensitive layer, and a first quenchers distributed in the first photosensitive layer and having a first concentration. The second photosensitive layer includes a second PAG distributed in the second photosensitive layer, and a second quenchers distributed in the second photosensitive layer and having a second concentration greater than the first concentration.

In another embodiment, a method for lithography patterning includes forming a first photosensitive layer on a substrate, the first photosensitive layer including a first photo-acid generator (PAG) of a first concentration. The method further includes forming a second photosensitive layer on the first photosensitive layer, the second photosensitive layer including a second PAG of a second concentration less than the first concentration. An exposing process can then be performed on the first and second photosensitive layers.

In one embodiment, a photosensitive material includes a polymer that turns soluble to a base solution in response to reaction with acid, a plurality of photo-acid generators (PAGs) that decompose to form acid in response to radiation energy, and a plurality of quenchers having a boiling point greater than about 300 C.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1a through 1c illustrate sectional views of one exemplary semiconductor device having a photosensitive layer being exposed during a lithography process.

FIGS. 2a through 2c illustrate sectional views of semiconductor device having a photosensitive layer at various stages of a lithography process constructed according to aspects of the present disclosure in one embodiment.

FIGS. 3a through 3d illustrate sectional views of semiconductor device having a photosensitive layer at various stages of a lithography process constructed according to aspects of the present disclosure in another embodiment.

FIGS. 4a and 4b illustrate various embodiments of a photosensitive material having high boiling-point quencher.

FIG. 8 provides a table of comparison among various photosensitive materials according to various embodiments.

FIG. 9 provides a table of comparison among various photosensitive materials according to various embodiments.

FIGS. 11a through 11d illustrate sectional views of a semiconductor device at various stages of a lithography process constructed according to aspects of the present disclosure.

FIGS. 13a through 13d illustrate sectional views of a semiconductor device at various stages of a lithography process constructed according to aspects of the present disclosure.

DETAILED DESCRIPTION

Figure 5:
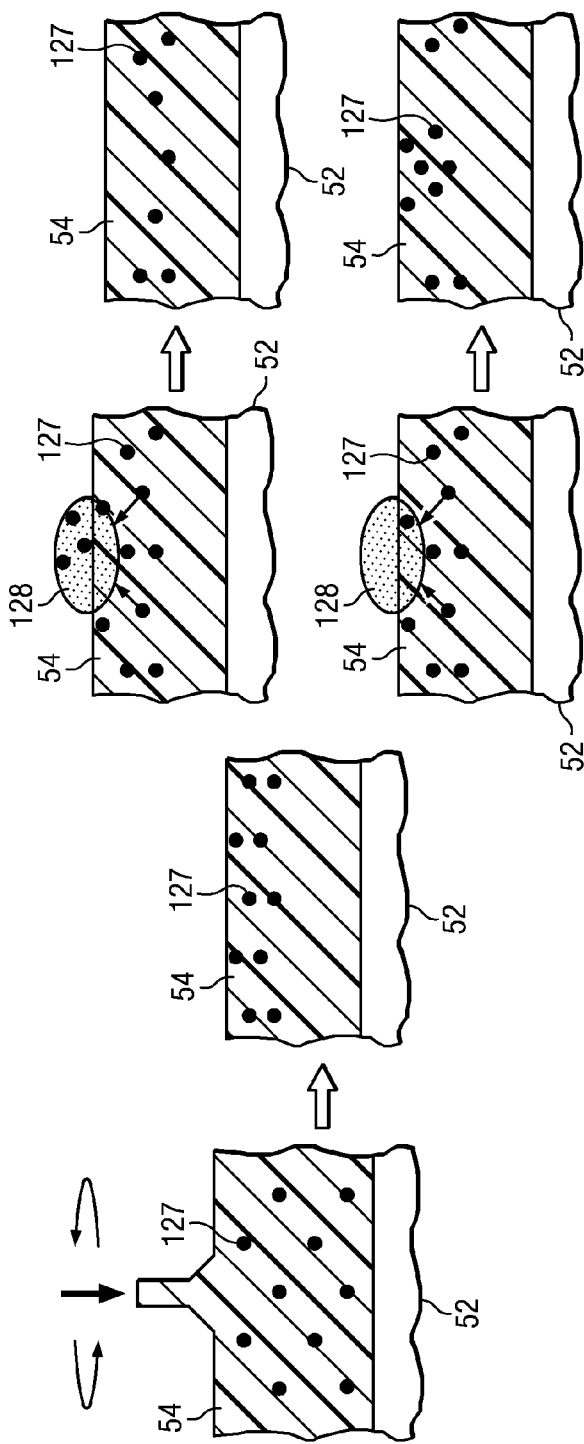
FIG. 5 illustrate sectional views of a semiconductor device having a photosensitive layer at various stages of a lithography process constructed according to aspects of the present disclosure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1a through 1c provide sectional views of a semiconductor device 50 at various lithography processing steps. In a current lithography process for patterning a substrate 52, a photoresist layer 54 is coated on the substrate 52 as shown in FIG. 1a; then an ultraviolet (UV) beam is applied to the photoresist layer 54 during an exposure process, generating acid 56 in the exposed photoresist. However, the light intensity decreases due to the light absorption by the photoresist component (such as the photo acid generator) or topography issue, resulting in the corresponding top rich and bottom weak acid distribution, as illustrated in FIG. 1b. After post exposure baking (PEB) and developing by a basic solution, an opening 58 is revealed with a top rounding and/or scamming profile, as illustrated in FIG. 1c.

FIGS. 2a through 2c provide sectional views of a semiconductor device 100 at various lithography patterning steps. Referring to FIGS. 2a through 2c, the semiconductor device 100 and the method making the same are collectively described. The semiconductor device 100 may be a semiconductor wafer or other suitable device. In the present embodiment, the semiconductor device 100 includes a silicon substrate 102 having various doped regions, dielectric features, and/or multilevel interconnects. The substrate may alternatively include other suitable semiconductor material, including Ge, SiGe, or GaAs. The substrate may alternatively include a non-semiconductor material such as a glass plate for thin-film-transistor liquid crystal display (TFT-LCD) devices. The semiconductor device 100 may further include one or more material layers to be patterned. Additionally, disposed on the semiconductor substrate 102 are other suitable material layers including organic bottom anti reflecting coating (BARC), inorganic BARC, etch resistance organic layer, and/or adhesion enhancement organic layer.

A photosensitive material layer (or photosensitive layer, photoresist layer or resist layer) 104 is disposed on the substrate 102. For example, a spin-coating technique is utilized to form the photosensitive layer 104 on the substrate 102. In the present embodiment, the photosensitive layer 104 has a thickness ranging between about 500 angstroms and about 5000 angstroms. In another embodiment, the photosensitive layer 104 may have a thickness ranging between about 1000 angstroms and 2000 angstroms. The photosensitive layer 104 utilizes a chemical amplification (CA) resist material. In one embodiment, a positive CA resist material includes a polymer material that turns soluble to a developer such as a base solution after the polymer is reacted with acid. Alternatively, the CA resist material can be negative and include a polymer material that turns insoluble to a developer such as a base solution after the polymer is reacted with acid. The photosensitive layer 104 further includes a solvent filling inside the polymer. The solvent may be partially evaporated by a soft baking process. The photosensitive layer 104 also includes photo-acid generator (PAG) distributed in the photosensitive layer. When absorbing photo energy, the PAG decomposes and forms a small amount of acid. The PAG may have a concentration ranging between about 1% and 15% wt of the photosensitive layer 104.

The photosensitive layer 104 also includes a quencher 106 distributed in the solvent and polymer. The quencher 106 is base type and is capable of neutralizing acid. Collectively or alternatively, the quencher may inhibit other active components of the photosensitive layer 104, such as inhibiting photo acid from reaction. The quencher 106 is not uniformly distributed in the photosensitive layer 104 along a direction 108 perpendicular to the photosensitive layer. Particularly, the quencher 106 has a vertically graded distribution in the photosensitive layer 104 such that the top concentration is greater than the bottom concentration. In one particular embodiment, a top portion 110 of the photosensitive layer has a thickness of about 25% of the photosensitive layer; a bottom portion 112 of the photosensitive layer has a thickness of about 25% of the photosensitive layer. The quencher 106 is distributed in the top portion 110 with a first concentration C1; the quencher is distributed in the bottom portion 112 with a second concentration C2; and the first concentration is greater than the second concentration by an amount ranging between about 5% to about 30%. In other words, (C1−C2)/C2 ranges between about 5% and about 30%. A soft baking process may be further applied to the photosensitive layer 104 to reduce the solvent in the photosensitive layer.

The semiconductor device 100 is then moved to a lithography apparatus for an exposing process. In one embodiment, the exposing process utilizes an immersion photolithographic technique. In the exposing process, the photosensitive layer 104 is exposed to a radiation energy such as deep ultra-violet (DUV) through a photomask (mask or reticle) having a predefined pattern, resulting in a resist pattern that includes a plurality of exposed regions such as exposed features 114 and a plurality of unexposed regions. The radiation energy may include a 248 nm beam by Krypton Fluoride (KrF) excimer lasers or a 193 nm beam by Argon Fluoride (ArF) excimer lasers. The lithography apparatus may further include an immersion fluid between the semiconductor device 100 and a lens of a lithography apparatus. The immersion fluid may include de-ionized water (DI water or DIW). The fluid may further include chemical additives such as acid, salt, or polymer.

In this embodiment, the photosensitive layer 104 is positive. Through the interaction between the PAG and the radiation energy, acid 116 is generated in the exposed region 114 of the photosensitive layer 104. As mentioned earlier, various light effects can introduce a deviation from the uniformly distributed acids. For example, light absorption causes the light density to be less in the bottom of the photosensitive layer, therefore, less acid is generated there. In another example, the topography issue (rough surface) introduces diffraction and further degrades the distribution of the generated acid. In the present disclosure, the quencher 106 has a graded distribution in a way that the concentration decreases from the top surface to the bottom surface of the photosensitive layer; the graded distribution of the quencher compensates the light effects. Therefore, the generated acid 116 in the exposed region 114 of the photosensitive layer is uniformly distributed along the vertical direction 108, as illustrated in FIG. 2b.

In one embodiment, a post-exposure baking (PEB) process may be applied to the exposed the photosensitive layer. Then a developing solution (developer) is applied to the photosensitive layer to develop the exposed photosensitive layer, forming an opening 118 with vertical profile that is relatively free of defects (e.g., reduced top rounding and scumming profile), as illustrated in FIG. 2c.

FIGS. 3a through 3d provide sectional views of a semiconductor device 120 at various lithography patterning steps. The semiconductor device 120 and the method making the same are collectively described with reference to these figures. The semiconductor device 120 includes a substrate 102. A photosensitive layer 122 is coated on the substrate 102. The photosensitive layer 122 utilizes a chemical amplification (CA) resist material. In one embodiment, a positive CA resist material includes a polymer material that turns soluble to a developer such as a base solution after the polymer is reacted with acid. The photosensitive layer 122 further includes a solvent filling inside the polymer. The photosensitive layer 122 also includes PAG distributed in the photosensitive layer. When absorbing photo energy, the PAG decomposes and forms a small amount of acid. The photosensitive layer 122 includes high boiling point (BP) quencher 124 distributed in the photosensitive layer, as shown in FIG. 3a. In one embodiment, the quencher has a boiling point ranging between about 200 C. and about 350 C. In another embodiment, the quencher 124 includes a molecular weight (MW) ranging between about 300 Dalton and about 20,000 Dalton. For example, the average MW ranges between about 300 Dalton and about 20,000 Dalton. In another embodiment, the molecular weight of the quencher is dispersed and the quencher 124 includes molecular weights distributed in a range between about 300 Dalton and about 20,000 Dalton. In this case, the boiling point of the quencher 12 is distributed in a range between about 200 C. and about 350 C.

The coated photosensitive layer 104 may be baked in a step, referred to as pre baking process, to reduce the solvent. During the coating process and the pre baking process, the quencher 124 is concentrated in the top portion of the photosensitive layer due to the surface energy and/or phase separation. In one example, the quencher is concentrated in a top portion by phase separation. In one embodiment, the top phase separated portion has a thickness ranging between 10 angstrom and 3000 angstrom. In another embodiment, the top phase separated portion has a thickness ranging between 10 angstrom and 1000 angstrom.

Particularly, the quencher diffuses toward the top surface of the photosensitive layer and is redistributed such that the concentration of the quencher is increased from the bottom to the top surface. The quencher is designed to enhance the surface energy difference or phase separation such that the quencher will diffuse toward the top surface because of one or more factors associated with the surface energy difference and phase separation. In various embodiments, these factors include, molecular weight difference, polarity difference, hydrophilic/hydrophobic difference, solubility to solvent difference, and polymer solubility. In one example, molecular weight difference is a such factor to introduce diffusion toward to the top surface because an additive (such as quencher in the present example) having a lower molecular weight can diffuse into a top region of the photosensitive layer during a pre bake process. Another example is polarity difference. An additive having different polarity to the solvent can diffuse into the top region of the photosensitive layer during a pre bake process. For example, if the resist material is more non polar compared to the additive, the additive will diffuse to the top surface during or after a thermal baking process. Another example is hydrophilic/hydrophobic difference. If an additive has different hydrophilic/hydrophobic ratio, the additive will separate and diffuse during a thermal baking process. Another example is the difference of solubility to solvent. If the additive has a solubility to the solvent higher than the backbone resist polymer, the additive can diffuse into the top region of the resist during a baking process. Another example is polymer solubility. If the additive polymer and the resist polymer have different hydrogen bonding or Vander Waal force with each other, it will cause separation during thermal baking.

After a pre baking process, the quencher 124 is redistributed with a graded distribution along the direction perpendicular to the substrate 102, such as the one described in FIG. 2a. In one embodiment, a top portion of the photosensitive layer has a thickness of about 25% of the photosensitive layer; a bottom portion of the photosensitive layer has a thickness of about 25% of the photosensitive layer; the quencher is distributed in the top portion with a first concentration C1; the quencher is distributed in the bottom portion with a second concentration C2; and the first concentration is greater than the second concentration. In furtherance of the embodiment, (C1−C2)/C2 ranges between about 5% and about 30%.

The quencher used in the conventional CA photoresist has low molecular weight (such as 100~300) and low boiling ranges (such as 100~250 C). The quencher in the top surface portion is evaporated from the surface, thus the concentration of quencher is reduced in the top surface portion. In the present disclosure, the quencher has increased both the molecular weight and boiling temperature (or boiling point). With reference to FIG. 3c, the surface evaporation 126 is substantially reduced or eliminated due to the high molecular weight and boiling point. The graded distribution of the quencher is substantially maintained, as shown in FIG. 3d.

The semiconductor device 120 and the method making the same provide a way to achieve the graded quencher concentration described in FIG. 2a using the quencher having high molecular weight and high boiling point. FIGS. 4a and 4b provide two examples of the quencher 124 having high molecular weight and high boiling point. In one example, the quencher is a trisubstituent amine with a formula shown in FIG. 4a, in which each of Ra, Rb and Rc include H or alkyl groups with carbon number 6~15. Each of Ra, Rb and Rc may further includes a chemical group selected from the —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; and epoxyl groups. R* is H, an unbranched or branched, cyclic or noncyclic, saturated or unsaturated alkyl or alkenyl or alkynyl groups.

In another example, the quencher is polymeric quencher with a formula shown in FIG. 4b. In the formula, R1~R5 are H, F, alkyl, and fluoroalkyl groups with carbon number equal or less than 3. Ra~Rd and Rf are linking groups, and which comprise at least one of the —CO—; —C(=O)O—; —S—; —P—; —P(O2)-; —C(=O)S—; —O—; —N—; —C(=O)N—; —SO2O—; —SO2S—; —SO—, and —SO2-. R6~R11 and Rz are straight, branched or cylclic alky, fluoro alkyl, alkoxyl, and fluoro alkoxyl chain with carbon number from 1~15 and may further include one of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si (OR*)3; —Si(R*)3; epoxyl groups, and combinations thereof. R* is H, an unbranched or branched, cyclic or noncyclic, saturated or unsaturated alkyl or alkenyl or alkynyl groups. The parameter 'x' is between 1~20. The above polymeric quencher has a molecular weight distributed in a range between 1000 and 20000 Daltons.

The differences between the conventional quencher and the disclosed quencher, and the advantages of the disclosed quencher are further explained in one example below with reference to FIG. 5 and FIG. 6. FIG. 5 are sectional views of the conventional photoresist 54 in various processing stages. Referring to FIG. 5, a conventional quencher 127 has a molecular weight less than 300 Daltons. When an immersion lithography process is implemented, the strong interaction between the immersion liquid, such as water drop 128, will lead to leaching of the quencher to the water or quencher aggregation with non-uniform horizontal distribution of the quencher. The leaching reduces the concentration of the quencher in the top surface portion. The aggregation degrades the critical dimension uniformity (CDU). In one example of forming contact holes using the conventional photoresist, some contact holes are missing (blind) due to the CDU degradation.

Figure 6:
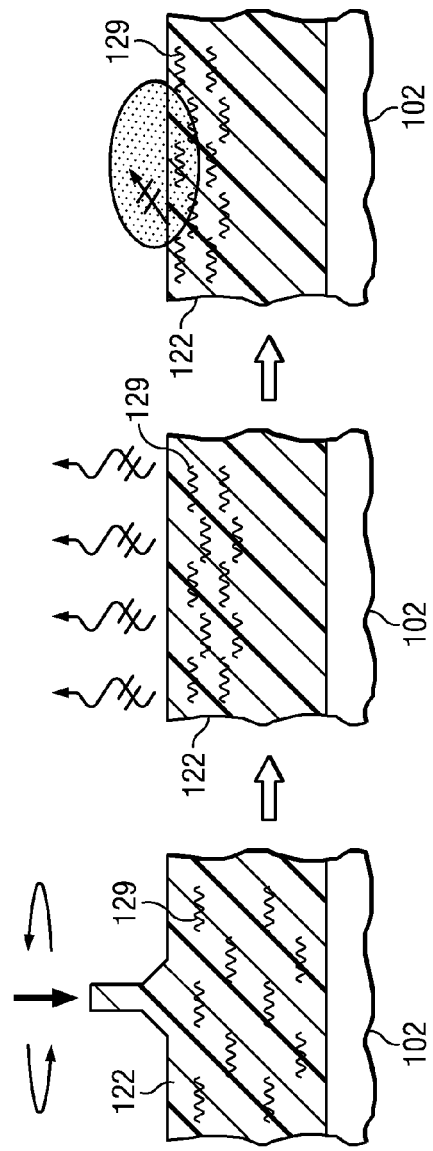
FIG. 6 illustrate sectional views of a semiconductor device having a photosensitive layer at various stages of a lithography process constructed according to aspects of the present disclosure.

FIG. 6 provides a photosensitive layer 122 incorporated with a polymeric quencher 129 having molecular weight greater than 1000 Daltons according to various aspects of the present disclosure. Because of the high molecular weight, the mobility of the quencher is substantially reduced. The leaching and aggregation are eliminated or reduced accordingly. The high concentration of the quencher in the top portion of the resist layer is maintained with a non-uniform distribution along the vertical direction. A uniform distribution in the surface (or horizontal direction) is maintained as well.

Figure 7:
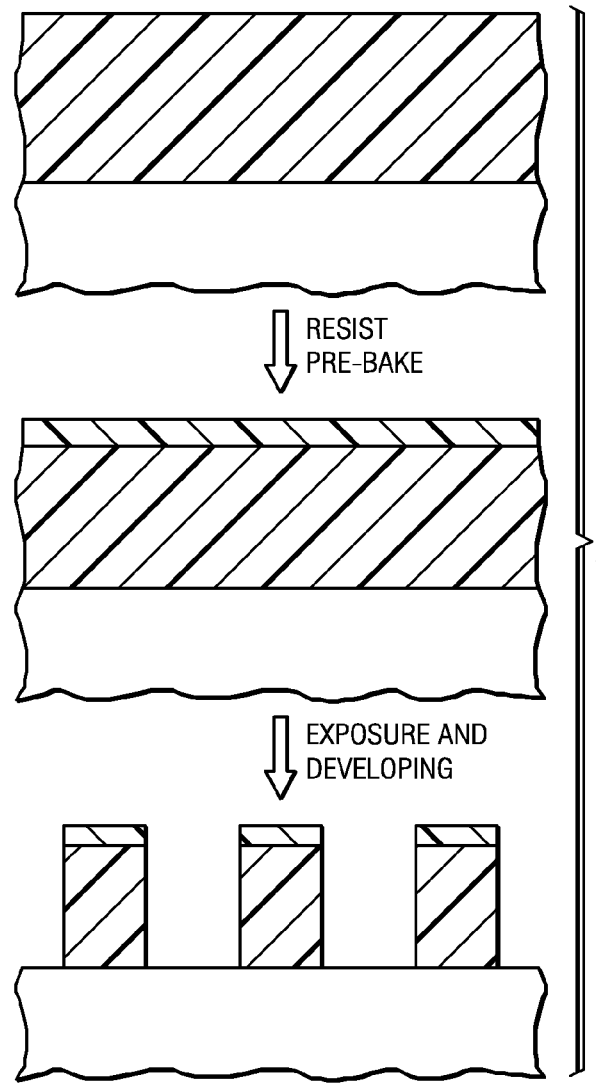
FIG. 7 illustrate sectional views of a semiconductor device having a photosensitive layer at various stages of a lithography process constructed according to aspects of the present disclosure.

FIG. 7 provides one example of a surface switchable photosensitive layer (photoresist or resist) coated on a wafer and the method of using the same in a lithography process. During the baking process, some of the switchable polymer inside the resist film move to the surface portion of the resist film, and are substantially separated from the bottom normal resist polymer. The switchable polymer can increase its solubility to water after contacting to base solution (such as tetramethyl ammonium hydroxide developing solution). After a pattern exposing process, PEB, and developing, the resist pattern is formed and the switchable polymer is substantially taken away during the developing process. Therefore, the resist top loss for the switchable resist is more than a conventional resist.

FIG. 8 provides a table of comparison among various resist material according various more embodiments of the present disclosure. FIG. 9 provides another table of comparison among various resist material according to various embodiments of the present disclosure.

Figure 10:
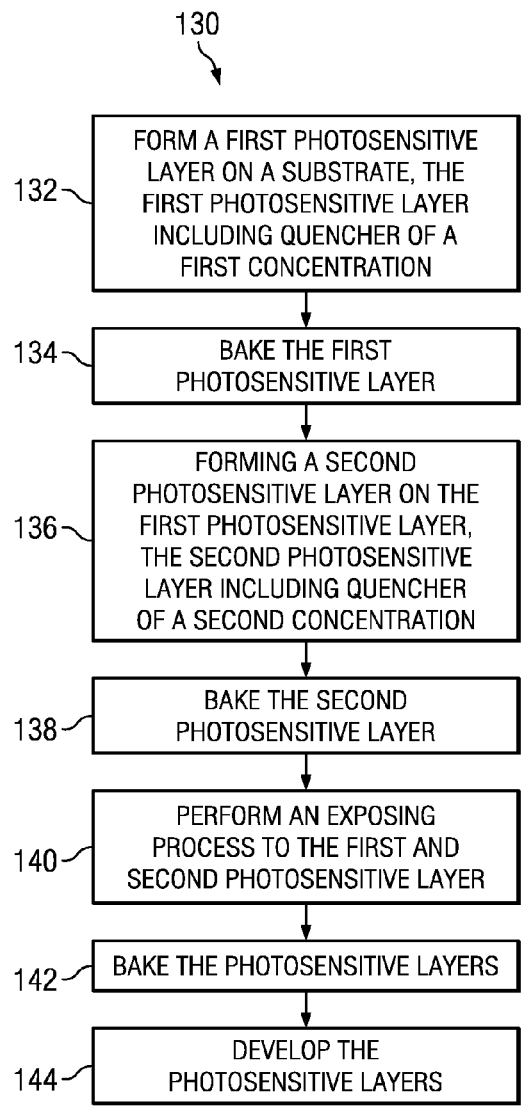
FIG. 10 is a flowchart of a method for immersion photolithography patterning constructed according aspects of the present disclosure in one embodiment.

FIG. 10 provides a flowchart of a lithography method 130. FIGS. 11a through 11d provide sectional views of a semiconductor device 150 fabricated by the method 130 through various lithography patterning steps, constructed according to various aspects of the present disclosure. Referring to FIGS. 10 and 11a~11d, the method 130 and the semiconductor device 150 are collectively described. The semiconductor device 150 includes a substrate 152, substantially similar to the substrate 102 of FIG. 2.

The method 130 begins at step 132 by forming a first photosensitive layer 154 on the substrate 152, as illustrated in FIG. 11a. The first photosensitive layer 154 utilizes a chemical amplification (CA) resist material. In one embodiment, a positive CA resist material includes a polymer material that turns soluble to a developer such as a base solution after the polymer is reacted with acid. The first photosensitive layer 154 further includes a solvent filling inside the polymer material. The first photosensitive layer 154 includes quencher 156 of a first concentration.

The method 130 may proceed to next step 134 by baking the first photosensitive layer 154 to reduce the solvent in the first photosensitive layer.

The method 130 proceeds to step 136 by forming a second photosensitive layer 158 on the first photosensitive layer 154, as illustrated in FIG. 11b. The second photosensitive layer 158 utilizes a chemical amplification (CA) resist material. In one embodiment, a positive CA resist material includes a polymer material that turns soluble to a developer such as a base solution after the polymer is reacted with acid. The second photosensitive layer 158 further includes a solvent filling inside the polymer material. The second photosensitive layer 158 includes quencher 160 of a second concentration substantially greater than the first concentration.

The method 130 may proceed to next step 138 by baking the second photosensitive layer 158 to reduce the solvent in the second photosensitive layer.

By the two photosensitive layers formed on the substrate in the disclosed method, the total photosensitive layer (including both the first and second photosensitive layers) thus formed presents a graded quencher distribution along the vertical direction. In one embodiment, the quencher distribution in the total photosensitive layer is substantially similar to the quencher distribution of the photosensitive layer 104 in FIG. 2a. In another embodiment, the graded distribution of the quencher is tuned to substantially compensate the optical effect in order to form an opening with vertical profile.

Two photosensitive layers are formed to achieve graded quencher distribution. One or more additional photosensitive layers may be formed in a similar way. Each layer has its own quencher concentration. Various photosensitive layers and their quencher concentrations are designed such that the quencher distribution in the total photosensitive layer is tuned to a profile capable of substantially compensating the optical effect of the CA resist material during the lithography exposing process. In one embodiment, a third photosensitive layer of a third concentration is formed on the second photosensitive layer and the third concentration is greater than the second concentration. A baking process may be applied to the third photosensitive layer to reduce the solvent of the third photosensitive layer. In another embodiment, a fourth photosensitive layer of a fourth concentration is formed on the third photosensitive layer and the fourth concentration is greater than the third concentration. A baking process may be followed and applied to the fourth photosensitive layer to reduce the solvent of the fourth photosensitive layer. All photosensitive layers are collectively referred to as a total photosensitive layer. In one example, the total photosensitive layer includes a top portion having a thickness of about 25% of the total photosensitive layer; a bottom portion of the total photosensitive layer has a thickness of about 25% of the total photosensitive layer; the quencher is distributed in the top portion with a first concentration C1; the quencher is distributed in the bottom portion with a second concentration C2; and the first concentration is greater than the second concentration. Particularly, (C1−C2)/C2 ranges between about 5% and about 30%. In furtherance of the embodiment, the total photosensitive layer is formed by four deposition procedures and the fourth deposited layers have a same thickness. The first layer has a first concentration R1 and the fourth layer has a fourth concentration R4. Then the (R4-R1)/R1 ranges between about 5% and about 30%.

The method 130 further proceeds to step 140 by performing an exposing process to the total photosensitive layer, resulting in an exposed region 162 in the total photosensitive layer, as illustrated in FIG. 11c. The method 130 further includes an post-exposure baking (PEB) process 142 applied to the total photosensitive layer.

The method 130 proceeds to step 144 to develop the total photosensitive layer by a developing solution, forming an opening 164 in the photosensitive layer. In one embodiment, the developing solution is basic solution. For example, the developing solution is tetramethyl ammonium hydroxide (TMAH) solution with a proper concentration, such as about 2.38%. Since the graded quencher concentration is tuned and the optical effects (explained in FIGS. 1a~1c) are substantially compensated. Therefore, the formed opening 164 has a vertical profile, as illustrated in FIG. 11d. The top rounding and the scumming profile are eliminated or reduced.

Figure 12:
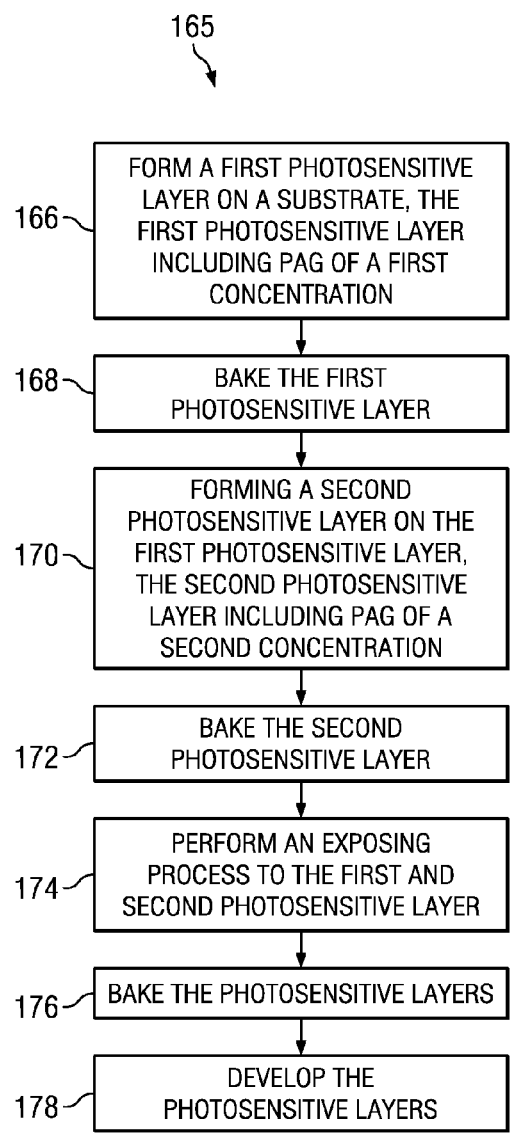
FIG. 12 is a flowchart of a method for immersion photolithography patterning constructed according aspects of the present disclosure in another embodiment.

FIG. 12 provides a flowchart of a lithography method 165. FIGS. 13a through 13d provide sectional views of a semiconductor device 180 fabricated by the method 165 at various lithography patterning steps, constructed according to various aspects of the present disclosure. Referring to FIGS. 12 and 13a~13d, the method 165 and the semiconductor device 180 are collectively described. The semiconductor device 180 includes a substrate 182, substantially similar to the substrate 102 of FIG. 2.

The method 165 begins at step 166 by forming a first photosensitive layer 184 on the substrate 182, as illustrated in FIG. 13a. The first photosensitive layer 184 utilizes a chemical amplification (CA) resist material. In one embodiment, a positive CA resist material includes a polymer material that turns soluble to a developer such as a base solution after the polymer is reacted with acid. The first photosensitive layer 184 further includes a solvent filling inside the polymer material. The first photosensitive layer 184 includes photo-acid generator (PAG) 186 of a first concentration.

The method 165 may proceed to next step 168 by baking the first photosensitive layer 184 to reduce the solvent in the first photosensitive layer.

The method 165 proceeds to step 170 by forming a second photosensitive layer 188 on the first photosensitive layer 184, as illustrated in FIG. 13b. The second photosensitive layer 188 utilizes a CA resist material. In one embodiment, a positive CA resist material includes a polymer material that turns soluble to a developer such as a base solution after the polymer is reacted with acid. The second photosensitive layer 188 further includes a solvent filling inside the polymer material. The second photosensitive layer 188 includes PAG 190 of a second concentration substantially less than the first concentration.

The method 165 may proceed to next step 172 by baking the second photosensitive layer 188 to reduce the solvent in the second photosensitive layer.

By the two photosensitive layers formed on the substrate in the disclosed method, the total photosensitive layer (including both the first and second photosensitive layers) thus formed presents a graded PAG distribution along the vertical direction. In one embodiment, the total photosensitive layer includes a top portion having a thickness of about 25% of the total photosensitive layer; a bottom portion of the total photosensitive layer has a thickness of about 25% of the total photosensitive layer; the PAG is distributed in the top portion with a first concentration P1; the PAG is distributed in the bottom portion with a second concentration P2; and the first concentration is less than the second concentration. Particularly, (P2−P1)/P1 ranges between about 5% and about 30%. In another embodiment, the graded distribution of the PAG is tuned to substantially compensate the optical effect in order to form an opening with vertical profile.

Two photosensitive layers are formed to achieve graded PAG distribution. One or more additional photosensitive layers may be formed in a similar way. Each layer has its own PAG concentration. Various photosensitive layers and their PAG concentrations are designed such that the PAG distribution in the total photosensitive layer is tuned to a profile capable of substantially compensating the optical effect of the CA resist material during the lithography exposing process. In one embodiment, a third photosensitive layer having the PAG of a third concentration is formed on the second photosensitive layer and the third concentration is less than the second concentration. A baking process may be applied to the third photosensitive layer to reduce the solvent of the third photosensitive layer. In another embodiment, a fourth photosensitive layer having PAG of a fourth concentration is formed on the third photosensitive layer and the fourth concentration is less than the third concentration. A baking process may be followed and applied to the fourth photosensitive layer to reduce the solvent of the fourth photosensitive layer. All photosensitive layers are collectively referred to as a total photosensitive layer. In one example, the total photosensitive layer includes a top portion having a thickness of about 25% of the total photosensitive layer; a bottom portion of the total photosensitive layer has a thickness of about 25% of the total photosensitive layer; the PAG is distributed in the top portion with a first concentration P1; the PAG is distributed in the bottom portion with a second concentration P2; and the first concentration is less than the second concentration. Particularly, (P2−P1)/P1 ranges between about 5% and about 30%. In furtherance of the embodiment, the total photosensitive layer is formed by four deposition procedures and the fourth deposited layers have a same thickness. The first layer has a first concentration R1 and the fourth layer has a fourth concentration R4. Then the (R4-R1)/R1 ranges between about 5% and about 30%.

The method 165 further proceeds to step 174 by performing an exposing process to the total photosensitive layer, resulting in an exposed region 192 in the total photosensitive layer, as illustrated in FIG. 13c. The method 165 further includes an post-exposure baking (PEB) process 176 applied to the total photosensitive layer.

The method 165 proceeds to step 178 to develop the total photosensitive layer by a developing solution, forming an opening 194 in the photosensitive layer. In one embodiment, the developing solution is basic solution. For example, the developing solution is tetramethyl ammonium hydroxide (TMAH) solution. Since the graded PAG concentration is tuned and the optical effects are substantially compensated. For example, the light absorption leads to less acid generation at the bottom; the less PAG concentration at the top also reduce the acid generated there; and the two effects can compensate each other and lead to the uniform acid concentration along the vertical direction. Therefore, the formed opening 194 has a vertical profile, as illustrated in FIG. 13d. The top rounding and the scumming profile are eliminated or reduced.

The present disclosure provides various methods and photosensitive materials for lithography patterning. Other variations in this spirit and scope are considered as consistent with the present disclosure and are suggestive. For example, the lithography patterning methods can be used to pattern one material layer disposed on a semiconductor wafer. This material layer can include silicon, silicon oxide, silicon nitride, titanium nitride, silicon oxynitride, metal oxide (e.g. aluminum oxide or hafnium oxide), metal nitride, metal oxynitride, or siloxane. An additional material layer, such as bottom anti-reflective coating (BARC), may be formed on the substrate before forming the photosensitive layer(s). The photosensitive material can be positive tone or alternatively negative tone. In another embodiment, the photosensitive material further includes chromophore, and/or surfactant. Alternatively, a photosensitive material may include photo-base generator. In another embodiment, a CA resist includes organic polymer that is acid cleavable. In multilayer photoresist method associated with the method 130 of FIG. 10 or the method 165 of FIG. 12, the second photoresist layer has a thickness ranging between about 20% and about 500% of the thickness of the first photoresist layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A lithography method, comprising:
forming a photosensitive layer on a substrate, the photosensitive layer including:
a polymer that turns soluble to a base solution in response to reaction with acid;
a plurality of photo-acid generators (PAGs) that decompose to form acid in response to radiation energy; and
a plurality of quenchers having boiling points distributed between about 200 C and about 350 C, having molecular weights distributed between about 300 Dalton and about 20000 Dalton, and vertically distributed in the photosensitive layer such that a first concentration C1 within a top 25% portion of the photosensitive layer is greater than a second concentration C2 within a bottom 25% portion of the photosensitive layer;
exposing the photosensitive layer;
baking the photosensitive layer; and
developing the exposed photosensitive layer.

2. The method of claim 1, wherein (C1−C2)/C2 ranges between about 5% and about 30%.

3. The method of claim 1, wherein the plurality of quenchers each comprises tri-substitute amine

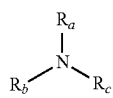

where Ra, Rb and Rc each includes one of H and an alkyl group and has a carbon number ranging between 6 and 15.

4. The method of claim 3, wherein each of Ra and Rb further includes a chemical unit selected from the group consisting of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; and epoxyl groups, in which R* is selected from the group consisting of H, alkyl group, alkenyl group, and alkynyl groups.

5. The method of claim 1, wherein the plurality of quenchers are polymeric quenchers having a structure

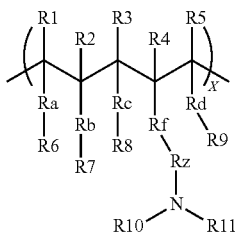

where each of R1~R5 includes one of H, F, alkyl, and fluoroalkyl groups with carbon number equal or less than 3; each of Ra~Rd and Rf includes a linking group and includes at least one of the —CO—; —C(=O)O—; —S—; —P—; —P(O2)-; —C(=O)S—; —O—; —N—; —C(=O)N—; —SO2O—; —SO2S—; —SO—, and —SO2-; each of R6~R11 and Rz includes one of straight, branched, cylclic alky, fluoro alkyl, alkoxyl, and fluoro alkoxyl chain with carbon number ranging from 1 to 15; and x ranges between 1 and 20.

6. The method of claim 5, wherein the polymeric quenchers each has a molecular weight ranging between about 1000 Daltons and about 2000 Daltons.

7. The method of claim 5, wherein each of R6~R11 and Rz further includes one of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; and epoxyl group, where R* is selected from the group consisting of H, an unbranched, branched, cyclic, noncyclic saturated, unsaturated alkyl, alkenyl, and alkynyl groups.

8. The method of claim 1, wherein the exposing the photosensitive layer is implemented in an immersion lithography apparatus.

9. A method for a lithography process, comprising:
forming a first photosensitive layer on a substrate, the first photosensitive layer including
a first photo-acid generator (PAG) distributed in the first photosensitive layer and first quenchers distributed in the first photosensitive layer and having a first concentration;
forming a second photosensitive layer on the first photosensitive layer, the second photosensitive layer including a second PAG distributed in the second photosensitive layer and second quenchers distributed in the second photosensitive layer and having a second concentration greater than the first concentration; and
performing an exposing process to the first and second photosensitive layers,
wherein the first PAG has a third concentration and the second PAG has a fourth concentration less than the third concentration.

10. The method of claim 9, wherein the second concentration being greater than the first concentration by an amount ranging between about 5% and about 30%.

11. The method of claim 9, further comprising:
forming a third photosensitive layer on the second photosensitive layer, the third photosensitive layer including a third PAG distributed in the third photosensitive layer and third quenchers distributed in the third photosensitive layer and having a third concentration greater than the second concentration,
wherein the performing of the exposing process includes performing the exposing process to the first, second and third photosensitive layer.

12. The method of claim 9, further comprising
baking the first and second photosensitive layers, after the performing of the exposing process; and
developing the first and second photosensitive layers.

13. The method of claim 9, wherein each of the first quenchers has a molecular weight ranging between about 300 Daltons and about 20000 Daltons.

14. The method of claim 9, wherein each of the first quenchers has a boiling point ranging between about 200° C. and about 350° C.

15. A method for lithography patterning, comprising:
forming a first photosensitive layer on a substrate, the first photosensitive layer including a first photo-acid generator (PAG) of a first concentration;
forming a second photosensitive layer on the first photosensitive layer, the second photosensitive layer including a second PAG of a second concentration less than the first concentration, wherein the first concentration is greater than the second concentration by an amount ranging between about 5% and about 30%; and performing an exposing process to the first and second photosensitive layers, wherein the first photosensitive layer further includes a first quencher of a third concentration, the second photosensitive layer further includes a second quencher of a fourth concentration, and the fourth concentration is greater than the third concentration.

16. The method of claim 15, further comprising forming a third photosensitive layer on the second photosensitive layer, the third photosensitive layer including a third PAG of a third concentration less than the second concentration, wherein the performing of the exposing process includes performing the exposing process to the first, second and third photosensitive layer.

17. The method of claim 15, wherein at least one of the first and second quenchers has a molecular weight ranging between about 300 Daltons and about 20000 Daltons.

18. The method of claim 15, wherein performing the exposing process to the first and second photosensitive layers includes performing an immersion lithography exposure process.

19. A photosensitive material, comprising:
a polymer that turns soluble to a base solution in response to reaction with acid;
a plurality of photo-acid generators (PAGs) that decompose to form acid in response to radiation energy; and
a plurality of quenchers having a boiling point greater than about 300° C., wherein the plurality of quenchers includes molecular weights substantially distributed between about 1000 Dalton and about 20000 Dalton.

20. The material of claim 19, wherein the plurality of quenchers are polymeric quenchers having a structure

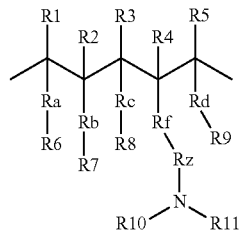

where each of R1~R5 includes one of H, F, alkyl, and fluoroalkyl groups with carbon number equal or less than 3; each of Ra~Rd and Rf includes a linking group and includes at least one of the —CO—; —C(=O)O—; —S—; —P—; —P(O2)-; —C(=O)S—; —O—; —N—; —C(=O)N—; —SO2O—; —SO2S—; —SO—, and —SO2-; each of R6~R11 and Rz includes one of straight, branched, cylclic alky, fluoro alkyl, alkoxyl, and fluoro alkoxyl chain with carbon number ranging from 1 to 15; and x ranges between 1 and 20.

21. The material of claim 20, wherein each of R6~R11 and Rz further includes one of —Cl; —Br; —I; —NO2; —SO3-; —H—; —CN; —NCO, —OCN; —CO2-; —OH; —OR*, —OC(O)CR*; —SR, —SO2N(R*)2; —SO2R*; SOR; —OC(O)R*; —C(O)OR*; —C(O)R*; —Si(OR*)3; —Si(R*)3; and epoxyl group, where R* is selected from the group consisting of H, an unbranched, branched, cyclic, noncyclic saturated, unsaturated alkyl, alkenyl, and alkynyl groups.

* * * * *